US012002895B2

(12) United States Patent
Schar et al.

(10) Patent No.: US 12,002,895 B2
(45) Date of Patent: Jun. 4, 2024

(54) STRUCTURING OF A PHOTOVOLTAIC APPARATUS

(71) Applicant: FLISOM AG, Niederhasli (CH)

(72) Inventors: Louis Schar, Zurich (CH); Thomas Netter, Winterthur (CH)

(73) Assignee: FLISOM AG, Niederhasli (CH)

( * ) Notice: Subject to any disclaimer, the term of this patent is extended or adjusted under 35 U.S.C. 154(b) by 999 days.

(21) Appl. No.: 16/926,581

(22) Filed: Jul. 10, 2020

(65) Prior Publication Data

US 2020/0343396 A1 Oct. 29, 2020

Related U.S. Application Data

(62) Division of application No. 16/060,087, filed as application No. PCT/IB2016/001761 on Dec. 13, 2016, now Pat. No. 10,734,538.

(Continued)

(51) Int. Cl.
*H01L 31/0465* (2014.01)
*B32B 37/26* (2006.01)
(Continued)

(52) U.S. Cl.
CPC .......... *H01L 31/0465* (2014.12); *B32B 37/26* (2013.01); *H01L 31/0201* (2013.01); *H01L 31/042* (2013.01); *H01L 31/048* (2013.01); *H01L 31/0543* (2014.12); *H01L 31/186* (2013.01); *H01L 31/1876* (2013.01);
(Continued)

(58) Field of Classification Search
CPC .. H01L 31/0543; H01L 31/0465; B32B 37/26
See application file for complete search history.

(56) References Cited

U.S. PATENT DOCUMENTS 4,537,838 A 8/1985 Jetter et al.
5,782,994 A 7/1998 Mori et al.
(Continued)

FOREIGN PATENT DOCUMENTS

CN 102315293 B 9/2013
DE 10356690 A1 2/2005
(Continued)

OTHER PUBLICATIONS

Machine translation JPH09172192A (Year: 1997).*
(Continued)

*Primary Examiner* — Jacob T Minskey
*Assistant Examiner* — Wayne K. Swier
(74) *Attorney, Agent, or Firm* — Patterson & Sheridan LLP

(57) ABSTRACT

A photovoltaic apparatus is provided including a back sheet and a photovoltaic device disposed over the back sheet. The photovoltaic device includes an array of photovoltaic cells extending in a first direction; and a plurality of serial interconnects having a length that extends in a second direction, wherein each serial interconnect is disposed between and electrically connects consecutive photovoltaic cells of the array. The photovoltaic apparatus further includes a front sheet disposed over the photovoltaic device, the front sheet having a plurality of structures, wherein each structure has one or more edges aligned with one of the serial interconnects.

19 Claims, 3 Drawing Sheets

Related U.S. Application Data

(60) Provisional application No. 62/267,685, filed on Dec. 15, 2015.

(51) Int. Cl.
  *B32B 38/00* (2006.01)
  *H01L 31/02* (2006.01)
  *H01L 31/042* (2014.01)
  *H01L 31/048* (2014.01)
  *H01L 31/054* (2014.01)
  *H01L 31/18* (2006.01)

(52) U.S. Cl.
  CPC .. *H01L 31/1896* (2013.01); *B32B 2038/0072* (2013.01); *B32B 2305/22* (2013.01); *B32B 2457/12* (2013.01); *H01L 31/1828* (2013.01); *Y02E 10/52* (2013.01)

(56) References Cited

U.S. PATENT DOCUMENTS

| | | | |
|---|---|---|---|
| 5,800,631 A * | 9/1998 | Yamada | H01L 31/02013 156/289 |
| 6,313,395 B1 | 11/2001 | Crane et al. | |
| 7,554,712 B2 | 6/2009 | Patry et al. | |
| 8,569,614 B2 | 10/2013 | Kang et al. | |
| 2002/0179231 A1 | 12/2002 | Weder | |
| 2003/0039035 A1 | 2/2003 | Yoshikawa et al. | |
| 2008/0053522 A1 | 3/2008 | Basol | |
| 2010/0154857 A1 | 6/2010 | Tell et al. | |
| 2010/0307565 A1* | 12/2010 | Suga | H01L 31/0543 136/246 |
| 2011/0048491 A1 | 3/2011 | Taira | |
| 2011/0240103 A1* | 10/2011 | Zhu | C09D 183/04 438/93 |
| 2011/0290304 A1 | 12/2011 | Daniel | |
| 2012/0103411 A1 | 5/2012 | Gonzalez | |
| 2012/0180844 A1 | 7/2012 | Ward, III | |
| 2012/0186624 A1 | 7/2012 | Lee | |
| 2013/0139882 A1 | 6/2013 | Nishida | |
| 2013/0145588 A1 | 6/2013 | Nakata | |
| 2014/0154857 A1 | 6/2014 | Tilke | |
| 2014/0305495 A1 | 10/2014 | Krajewski | |
| 2014/0338721 A1 | 11/2014 | Parent et al. | |
| 2015/0083192 A1* | 3/2015 | Nobori | H01L 31/076 136/246 |
| 2015/0318512 A1 | 11/2015 | Wehlus | |
| 2015/0349161 A1 | 12/2015 | Morad et al. | |
| 2015/0365046 A1 | 12/2015 | Lerner et al. | |
| 2016/0064587 A1 | 3/2016 | Hashimoto | |

FOREIGN PATENT DOCUMENTS

| | | |
|---|---|---|
| DE | 112014003918 T5 | 5/2016 |
| EP | 0002816 | 7/1979 |
| EP | 2234177 A1 | 9/2010 |
| EP | 2565938 A1 | 3/2013 |
| EP | 2669954 A1 | 12/2013 |
| EP | 2827382 | 1/2015 |
| JP | 09172192 A * | 6/1997 |
| JP | 2001168357 A * | 6/2001 |
| JP | 2002009323 A * | 1/2002 |
| JP | 2011155132 A * | 8/2011 |
| JP | 2012231009 A | 11/2012 |
| JP | 2015142096 A | 8/2015 |
| WO | 2008134677 A1 | 11/2008 |
| WO | 20130040036 A1 | 3/2013 |
| WO | 2015029657 A1 | 3/2015 |
| WO | 20150114498 A1 | 8/2015 |

OTHER PUBLICATIONS

Machine translation JP2002009323A (Year: 2002).*
Machine translation JP2011155132A (Year: 2011).*
Definition of parallelepiped: ttp://web.archive.org/web/20201020172139/https://byjus.com/maths/parallelepiped/ (Year: 2020).*
Machine translation JP2001168357A (Year: 2001).*
International Search Report and Written Opinion for PCT/IB2017/000006, dated May 11, 2017.
International Search Report and Written Opinion for PCT/IB2016/001761, dated Mar. 29, 2017.
International Search Report and Written Opinion for PCT/IB2016/001765, dated Mar. 31, 2017.

* cited by examiner

STRUCTURING OF A PHOTOVOLTAIC APPARATUS

CROSS-REFERENCE TO RELATED APPLICATIONS

This application is a divisional application of U.S. patent application Ser. No. 16/060,087, filed Jun. 7, 2018, which is a 371 U.S. National Stage of International Application No. PCT/IB2016/001761, filed Dec. 13, 2016, which claims priority to U.S. Provisional Patent Application No. 62/267,685, filed Dec. 15, 2015, the disclosures of which are all herein incorporated by reference in their entireties.

BACKGROUND

Field

Embodiments of the present disclosure generally relate to structuring a thin-film photovoltaic apparatus, and more particularly to structuring a transparent sheet of a thin-film photovoltaic apparatus.

Description of the Related Art

Photovoltaic apparatuses often include multiple layers that are laminated together. While laminating can produce a structure having high strength and stability, the heat and pressure of the lamination process can also cause stresses within the different layers of the laminated structure. For example, laminating can cause some layers (e.g., metallic layers) to expand and other layers (e.g., thermoplastic layers) to contract. These expansions and contractions and other stresses caused by the lamination process can cause deformations in the laminated layers, such as wrinkles and cracks in flexible layers, such as thin-film layers within the laminated photovoltaic devices or such as the transparent front sheet of the photovoltaic apparatus. These deformations can decrease the efficiency of the photovoltaic apparatus and expose interior portions of the photovoltaic apparatus to the environment leading to possible corrosion and UV damage among other problems.

Therefore, there is a need for an improved photovoltaic apparatus that can reduce the undesirable effects that can result from laminating the layers of a photovoltaic apparatus as well as a method for producing such a photovoltaic apparatus.

SUMMARY

Embodiments of the present disclosure generally relate to structuring a thin-film photovoltaic apparatus. In one embodiment, a photovoltaic apparatus is provided including a back sheet and a photovoltaic device disposed over the back sheet. The photovoltaic device includes an array of photovoltaic cells extending in a first direction, and a plurality of serial interconnects having a length that extends in a second direction, wherein each serial interconnect is disposed between and electrically connects consecutive photovoltaic cells of the array. The photovoltaic apparatus further includes a front sheet disposed over the photovoltaic device, the front sheet having a plurality of structures, wherein each structure has one or more edges aligned with one of the serial interconnects.

In another embodiment, a method of forming a photovoltaic apparatus is provided. The method includes placing a release sheet over a transparent sheet of a photovoltaic assembly. The release sheet includes a first plurality of fibers spaced apart in a first direction. The photovoltaic assembly includes a photovoltaic device including an array of photovoltaic cells extending in the first direction. The method further includes laminating the release sheet over the photovoltaic assembly to form a plurality of structures on a first surface of the transparent sheet.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to structuring a thin-film photovoltaic apparatus, and more particularly to structuring the front sheet of a thin-film photovoltaic apparatus.

Figure 1:
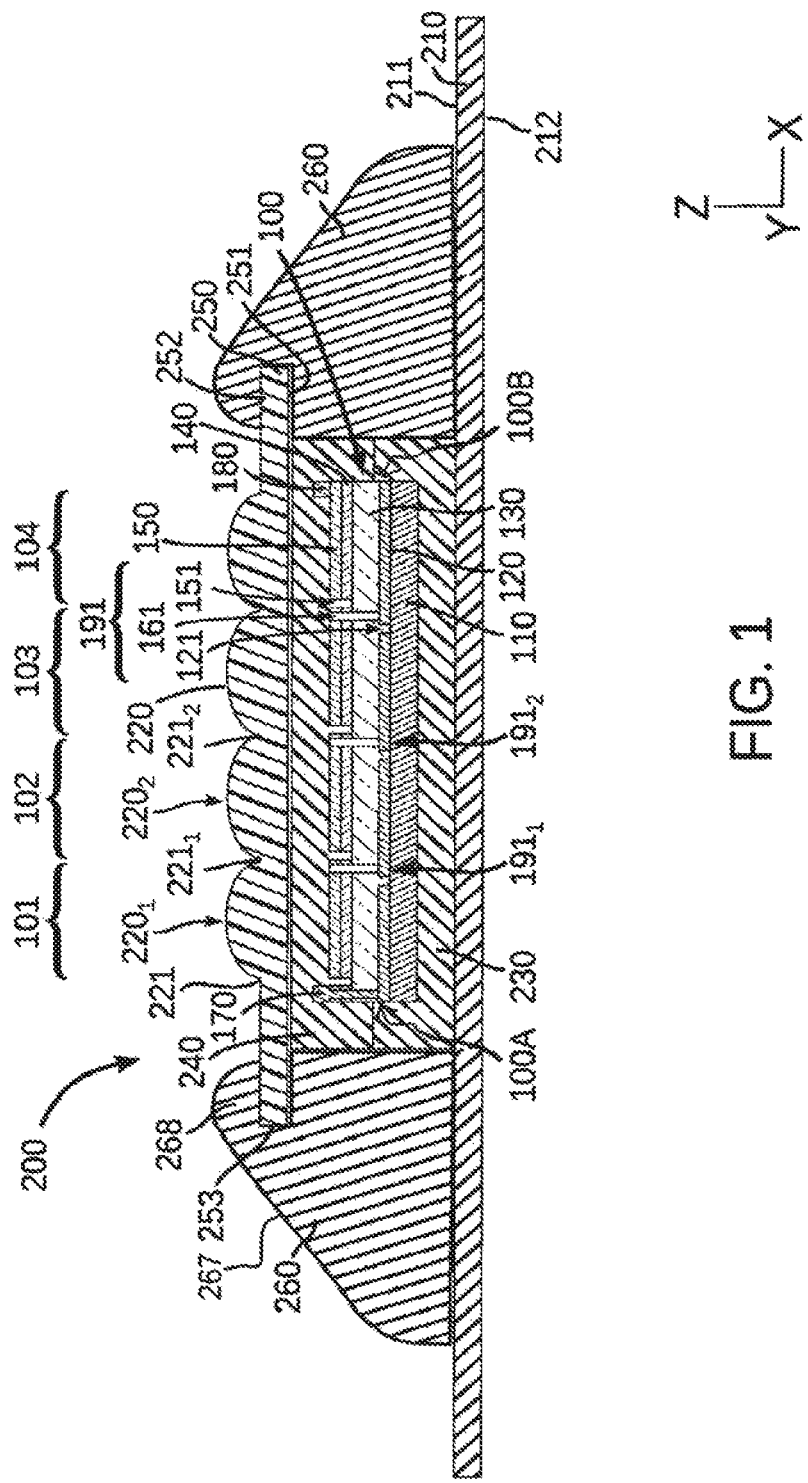
FIG. 1 is a cross sectional view of a photovoltaic apparatus, according to an embodiment of the disclosure provided herein.

FIG. 1 is a cross sectional view of a photovoltaic apparatus 200, according to an embodiment of the disclosure provided herein. The photovoltaic apparatus 200 may include multiple optoelectronic devices, such as photovoltaic devices, diodes, and LEDs. The view in FIG. 1 of the photovoltaic apparatus 200 is shown including a photovoltaic device 100 (or sub-module) including an array of four photovoltaic cells 101-104, the array extending from a first end 100A of the photovoltaic device 100 to a second end 100B of the photovoltaic device 100 in the X-direction. More or fewer photovoltaic cells may be included as required by the electrical generation application in which the photovoltaic device(s) will be used. The photovoltaic cells 101-104 are spaced apart in the X-direction (the first direction) and consecutive photovoltaic cells (e.g., 101, 102) are interconnected to each other by a plurality of serial interconnects 191 (i.e., also referred to as P1, P2 and P3 scribe lines) that extend in the Y-direction (the second direction). The layers of each photovoltaic cell 101-104, such as layers 120-150, are formed in a stacked orientation in the Z-direction (the third direction). In some applications, the photovoltaic cells 101-104 may also be isolated from additional photovoltaic cells (not shown) that are separated from each other in the Y-direction due to an X-direction isolation scribe line (not shown) that separates the photovoltaic cells to form an X-Y array of photovoltaic cells.

The photovoltaic cells (e.g., photovoltaic cells 101, 102) are electrically connected in series between bus bars 170, 180 by use of the formed serial interconnects 191. The photovoltaic device 100 is formed on a substrate 110. The substrate 110 may be a rigid substrate or a flexible substrate. The substrate 110 may also be formed from an electrically insulating material. For example, in one embodiment, a polyimide substrate may be used.

An electrically conductive back-contact layer 120 may be disposed on a surface of the substrate 110. The back-contact layer 120 can be fabricated from a material having a high optical reflectance and is commonly made of molybdenum (Mo) although several other thin-film materials, such as metal chalcogenides, molybdenum chalcogenides, molybdenum selenides (such as $MoSe_2$), sodium (Na)-doped Mo, potassium (K)-doped Mo, Na- and K-doped Mo, transition metal chalcogenides, tin-doped indium oxide (ITO), doped or non-doped indium oxides, doped or non-doped zinc oxides, zirconium nitrides, tin oxides, titanium nitrides, titanium (Ti), tungsten (W), tantalum (Ta), gold (Au), silver (Ag), copper (Cu), and niobium (Nb) may also be used or included advantageously. In some embodiments, the back-contact layer 120 is deposited onto the substrate 110 by use of a sputtering process.

At least one absorber layer 130 is disposed on the back-contact layer 120. Absorber layer 130 is typically made of an "ABC" material, wherein "A" represents elements in group 11 of the periodic table of chemical elements as defined by the International Union of Pure and Applied Chemistry including copper (Cu) or silver (Ag), "B" represents elements in group 13 of the periodic table including indium (In), gallium (Ga), or aluminum (Al), and "C" represents elements in group 16 of the periodic table including sulfur (S), selenium (Se) or tellurium (Te). An example of an ABC material is the $Cu(In,Ga)Se_2$ semiconductor also known as CIGS. In some embodiments, the absorber layer 130 may be a polycrystalline material. In other embodiments, the absorber layer 130 may be a monocrystalline material.

A semiconductive buffer layer 140 can be disposed on the absorber layer 130. The semiconductive buffer layer 140 ordinarily has an energy bandgap higher than 1.5 eV. The semiconductive buffer layer 140 may be formed of materials, such as CdS, Cd(S,OH), CdZnS, indium sulfides, zinc sulfides, gallium selenides, indium selenides, compounds of (indium, gallium)-sulfur, compounds of (indium, gallium)-selenium, tin oxides, zinc oxides, Zn(Mg,O)S, Zn(O,S) material, or variations thereof.

A front-contact layer 150 may be disposed on the semiconductive buffer layer 140. The front-contact layer 150 can be an electrically conductive and optically transparent material, such as a transparent conductive oxide (TCO) layer. For example, in some embodiments, the front-contact layer 150 may be formed of doped or non-doped variations of materials, such as indium oxides, tin oxides, or zinc oxides.

The first busbar 170 forms an electrical connection to the back-contact layer 120 of the first photovoltaic cell 101. The first busbar 170 may form the cathode of the photovoltaic device 100. In some embodiments, the first busbar 170 may be formed of a flexible material.

The second busbar 180 forms an electrical connection to the front-contact layer 150 of the fourth photovoltaic cell 104. The second busbar 180 may form the anode of the photovoltaic device 100. In some embodiments, the second busbar 180 may be formed of a flexible material.

The serial interconnect 191 forms an electrical connection between each consecutive photovoltaic cell 101-104 in the array. Each serial interconnect 191 includes a connecting groove 161 (i.e., the P2 scribe line) that is formed through the front-contact layer 150, the semiconductive buffer layer 140 and the absorber layer 130 to form an electrically conductive path that electrically connects consecutive photovoltaic cells in the array. The conductive path may be formed by melting a portion of the absorber layer 130 during a laser scribing process used to form the connecting groove 161. For example, one connecting groove 161 electrically connects the front-contact layer 150 of the third photovoltaic cell 103 to the back-contact layer 120 of the fourth photovoltaic cell 104.

Each serial interconnect 191 includes a pair of grooves to electrically isolate portions of each adjacent photovoltaic cell. A back-contact groove 121 (i.e., P1 scribe line) electrically isolates the back-contact layers 120 of adjacent photovoltaic cells, such as photovoltaic cells 103, 104 from each other. A front-contact groove 151 (i.e., P3 scribe line) electrically isolates front-contact layers 150 of adjacent photovoltaic cells, such as photovoltaic cells 103, 104 from each other. The serial interconnects 191 collectively electrically connect the photovoltaic cells 101-104 in series.

The photovoltaic device 100 may be encapsulated within the photovoltaic apparatus 200 by use of a front-side adhesive 240 and a back-side adhesive 230. In some embodiments, the front-side adhesive 240 and the back-side adhesive 230 completely surround the photovoltaic device 100. The front-side adhesive 240 is formed over the front-contact layer 150 of each of the photovoltaic cells 101-104 of the photovoltaic device 100, and also over the first and second busbars 170, 180. In some embodiments, it is desirable for the front-side adhesive 240 to also fill the front-contact grooves 151 between the front-contact layers 150 of the different photovoltaic cells 101-104. The front-side adhesive 240 can also surround all of the edges of the photovoltaic device 100 (i.e., the ends where the first and second busbars 170, 180 are located and edges that are parallel to the X-direction). The front-side adhesive 240 may be formed of a flexible material, such as a flexible polymer. For example, in one embodiment the front-side adhesive 240 may be formed of a thermoplastic olefin-(TPO) based polymer.

The back-side adhesive 230 is formed on the side of the substrate 110 opposite to the photovoltaic device 100. The back-side adhesive 230 can also surround all of the edges of the photovoltaic device 100 (i.e., the ends where the first and second busbars 170, 180 are located and edges that are parallel to the X-direction). The back-side adhesive 230 may be formed of a flexible material, such as a flexible polymer. For example, in one embodiment, the back-side adhesive 230 may be formed of a thermoplastic olefin-based polymer (TPO). The back-side adhesive 230 may contact the front side adhesive 240 at each end of the photovoltaic device 100 (i.e., the ends where the first and second busbars 170, 180 are located) and also on either side of the photovoltaic device 100 (i.e., both sides in the Y-direction of FIG. 1 that are not visible in the cross-section of FIG. 1), so that the front-side adhesive 240 and the back-side adhesive 230 completely surround and encapsulate the photovoltaic device 100.

A back sheet 210 can be disposed on an outer surface of the back-side adhesive layer 230, such as a bottom surface of the back-side adhesive layer 230. The back sheet 210 can be formed of a reflective material, such as a metal or a reflective polymer. In some embodiments, the back sheet 210 may be formed of a rigid material. In other embodiments, the back sheet 210 may be formed of a flexible material. In some embodiments, a fiber-reinforced polymer may be used as the material for the back sheet 210. In still other embodiments, the back sheet 210 may be formed of glass material. The back sheet 210 has a first surface 211 facing the photovoltaic device 100, and a second surface 212 opposite to the first surface 211.

A front sheet 250 (transparent sheet) can be disposed on an outer surface of the front-side adhesive layer 240, such as a top surface of the front-side adhesive layer 240. The front sheet 250 can be formed of a flexible, transparent material, such as a transparent thermoplastic polymer or a transparent foil (e.g., a barrier foil). The front sheet 250 has a first surface 251 facing the photovoltaic device 100, and a second surface 252 opposite to the first surface 251. The front sheet 250 further includes an outer edge 253 that extends from the first surface 251 to the second surface 252. In some embodiments, the front sheet 250 can be placed over the photovoltaic device 100 in a roll-to-roll process.

The front sheet 250 can include a plurality of structures 220. In some embodiments, the structures 220 can be formed into the shape of a lens, such as a convex lens. Each structure 220 can include one or more edges 221 that can be positioned over one of the serial interconnects 191 between adjacent photovoltaic cells, such as between photovoltaic cells 101, 102. In some embodiments, each structure 220 is disposed over one photovoltaic cell. For example, a first structure 2201 may be disposed over the first photovoltaic cell 101 and a second structure 2202 may be disposed over the second photovoltaic cell 102. As described in further detail below, the structures 220 can be formed during a lamination process in which the layers, such as layers 210 to 250 of the photovoltaic apparatus 200 are laminated together. In some cases, the lamination process may include the use of radiant heat and a pressure applying device that applies a force to the complete photovoltaic apparatus 200. In other cases, the lamination process may include, or further include, the use of radiant heat and two or more horizontally oriented rollers that apply a force in the Z-direction to the portion of the photovoltaic apparatus 200 disposed between the two or more rollers during the lamination process. Although the structures 220 are described as being formed on the front sheet 250, the structures 220 may be formed on other transparent flexible layers included in the photovoltaic apparatus 200 as well. Furthermore, although the structures 220 are generally described as being formed in a regular pattern, some embodiments may include structures formed in an irregular and/or non-uniform pattern.

Laminating can cause stresses in the laminated layers, such as the front sheet 250, which may result in deformations of the laminated photovoltaic apparatus 200. The deformations may appear as non-flatness of the photovoltaic apparatus or defects of the front sheet such as creases, wrinkles, or cracks. The deformations may commonly be found after laminating a photovoltaic apparatus with a thermoplastic front sheet. Furthermore, the roll-to-roll process that may be used to place the front sheet 250 over the photovoltaic device 100 can cause the formation of small defects in the front sheet 250, and these small defects can increase to larger deformations during a conventional laminating process. These deformations can decrease the efficiency of the photovoltaic apparatus 200 and reduce the longevity of the front sheet to protect the photovoltaic apparatus 200 from environmental damage such as that caused by water ingress, water vapor transmission, chemical degradation, abrasion, dirt accumulation, thermal cycling, UV-induced aging, or resistance to damage caused by animals. Damage to the front sheet may cause or accelerate corrosion of layers contained within the photovoltaic apparatus. In some embodiments, the structures 220 may be formed as convex embossings at the surface of the front sheet 250. The formed structures 220 prevent or minimize the amount of deformation of the front sheet 250 and adjacent layers by confining the lamination-induced stresses to the individual structures 220 and providing increased flexibility at their peripheral edges 221. The structures 220 may therefore be formed to alleviate anisotropic stresses that may develop within the photovoltaic apparatus 200 during the laminating process. The structures 220 can also serve to prevent the growth of the smaller defects formed during the roll to roll process into larger deformations during the lamination process. The edges 221 thus allow portions of the photovoltaic apparatus 200, such as portions in the form of adjacent structures 220, to flex or move with greater amplitude and degrees of freedom relative to each other than a conventional smooth-surface front sheet that has no structures 220. The ability of the structures 220 to deflect relative to each other can prevent or minimize the chance that the front sheet 250 will form creases, cracks, or cause distortions in adjacently positioned regions. Furthermore, because the structures 220 may reduce or modify the reflectivity of the front sheet, deformations on the front sheet 250 may be less visible to an observer. Furthermore, the flatness of the front sheet 250 can be improved relative to a front sheet with no structures 220 because forming the structures 220 facilitates thermoplastic expansion of the front sheet 250 during lamination and prevents forming defects at the surface of the front sheet. Additionally, forming the structures 220 can increase the rigidity of the front sheet 250 making the photovoltaic apparatus more resistant to deflection or damage when mechanical stresses are applied.

Figure 2A:
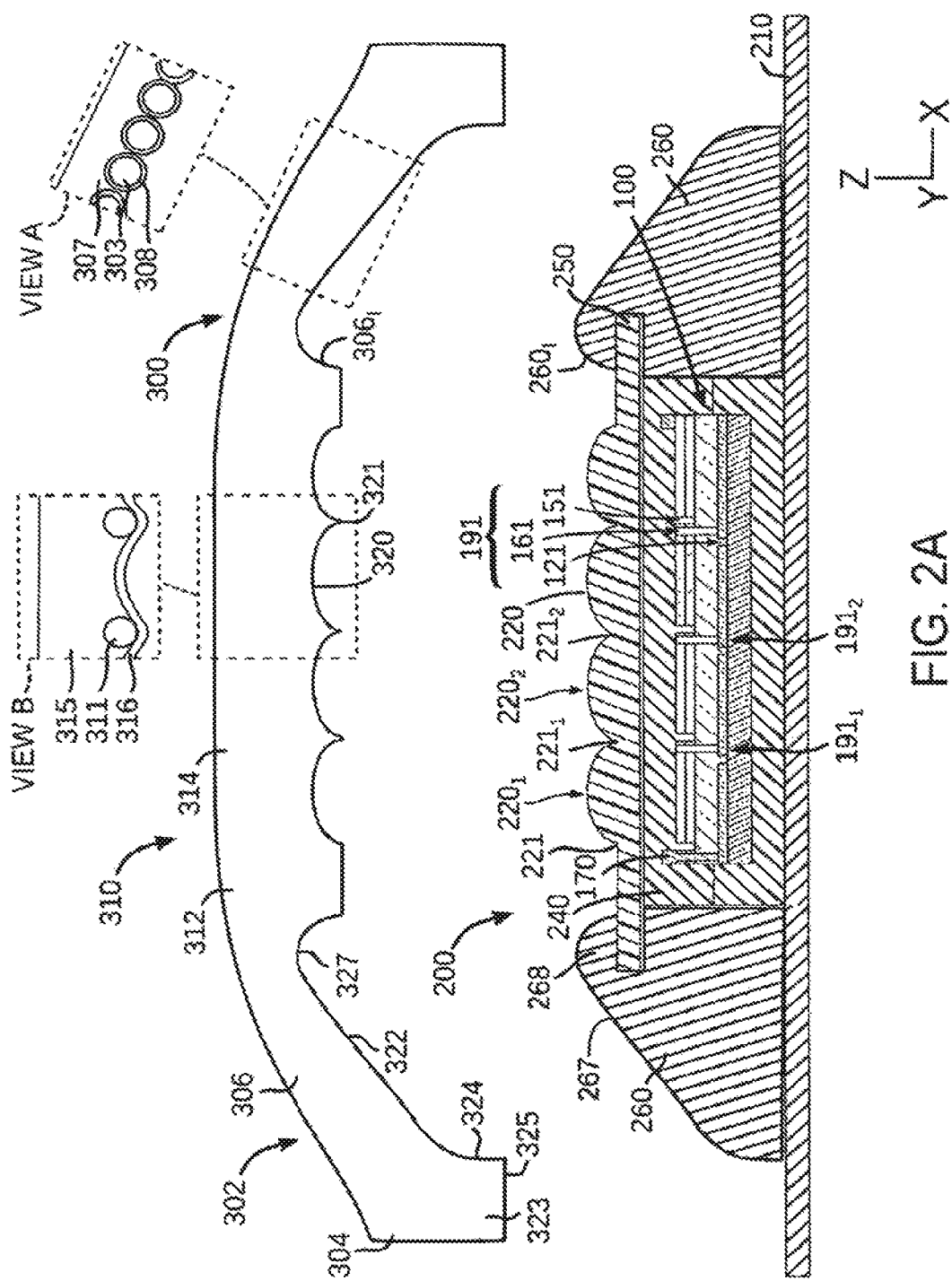
FIG. 2A is a cross sectional view of a release sheet disposed over the photovoltaic apparatus of FIG. 1 after laminating the photovoltaic apparatus with the release sheet, according to an embodiment of the disclosure provided herein.
Figure 2B:
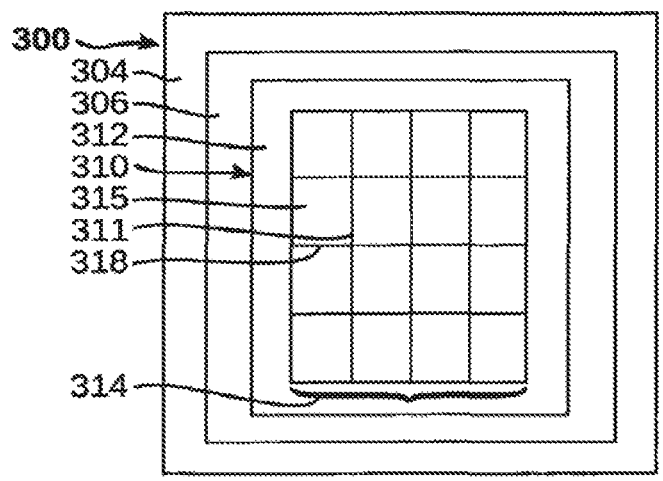
FIG. 2B is a top view diagram illustrating the release sheet of FIG. 2A, according to an embodiment of the disclosure provided herein.

The edges 221 of the structures 220 are formed by laminating the photovoltaic apparatus 200 with a release sheet 300 (FIGS. 2A, 2B). To form some embodiments of the photovoltaic apparatus 200, the release sheet 300 may include a plurality of gaps or deformable portions that are surrounded by less deformable edge features 321, such as woven non-compressible fibers 311 (FIGS. 2A, 2B). The lamination process therefore transfers most of its pressure via the less deformable edge features 321 to form embossings onto the front sheet 250. The formation of embossings may be facilitated by the fact that the underlying front-side adhesive 240 has a higher malleability at laminating temperatures than the front sheet 250.

Forming structures 220 on the front sheet 250 can also increase the amount of light absorption, especially at shallow angles of incident light (for example, less than 45° with respect to a plane tangent to a photovoltaic cell's surface). In some embodiments, the edges 221 of the structures 220 are formed over, or in further embodiments, directly adjacent to the area that is directly over, the serial interconnects 191 and not over portions of the absorber layer 130 (i.e., the layer that produces electricity), since it is believed that less light will be collected by regions of the photovoltaic device 100 disposed under the edges 221, which are recessed relative to the remaining portions of the structures 220. Thus, forming the edges 221 of the structures 220 over the serial interconnects 191 increases the efficiency of the photovoltaic apparatus 200 relative to forming the edges 221 at other locations. A photovoltaic apparatus embodiment may therefore include a front sheet 250 where all monolithic interconnects such as the serial interconnects 191 are covered by structure edges 221. Another photovoltaic apparatus embodiment may include a front sheet where structure edges 221 are only located over monolithic interconnects. Photovoltaic apparatus embodiments may therefore be formed by carefully aligning the less deformable edge features 321 of the release sheet 300 with monolithic interconnects of the photovoltaic device(s) 100. In some embodiments, the structures 220 can have a width in the X-direction from about 1 mm to about 20 mm, such as from about 2 mm to about 5 mm wide, such as about 4 mm. In some embodiments, the structures 220 may also have edges 221 that are formed in the Y-direction, and, in some cases are positioned over the X-direction isolation scribe lines.

The photovoltaic apparatus 200 further includes an edge seal 260 disposed between the front sheet 250 and the back sheet 210. The edge seal 260 can fill a region between the front sheet 250 and the back sheet 210 to create a seal for protecting the interior of the photovoltaic apparatus 200 from the environment. An inner surface (i.e., a surface facing the photovoltaic device 100) of each edge seal 260 may contact the front-side adhesive 240 and the back-side adhesive 230. The edge seal 260 may be formed of a flexible material, such as a polymer material, such as butyl. Using flexible materials to form the front sheet 250 and the edge seal 260 allows the structures 220 (e.g., lenses and other similar structures) to be formed during a lamination process, which would not be possible when using a non-flexible front sheet (e.g., glass front sheet) often used in conventional solar modules.

The seal 260 extends from the first surface 211 of the back sheet 210 past the outer edge 253 of the front sheet 250 to contact the second surface 252 of the front sheet 250. The edge seal 260 may include a front overlap 268 that extends past the second surface 252 of the front sheet 250 in the Z-direction. The front overlap 268 extends in the X-direction towards a center of the photovoltaic apparatus 200 in the X-direction. The presence of the front overlap 268 of the edge seal 260 forms an extended path length that the external environmental contaminants would need to bridge or cross during normal device operation to cause photovoltaic device deterioration or failure. The front overlap 268 may provide better overall adhesive properties to the edge seal 260. These better overall adhesive properties may provide a longer lifetime to the edge seal 260, for example, even when exposed to the daily thermal cycling seen by photovoltaic devices during normal operation. In some embodiments, the front overlap 268 extends in the X-direction to at least partially overlie the busbar 170, 180. In some embodiments, the front overlap 268 extends in the X-direction to fully overlie the busbar 170, 180. In general, the edge seal 260 comprises a polymeric material, such as an elastomer, for example, a butyl rubber that can be formed by dispensing a liquid precursor material along the edge of the photovoltaic apparatus 200 and allowing it to cure. The release sheet 300 (FIGS. 2A, 2B) can further be used to mold the edge seal 260 so that a stronger seal can be formed as described in fuller detail below.

In some embodiments, structures 220 are generated not only in the front sheet 250, but also in the edge seal 260. In some configurations, the structures 220 are completely or partially formed within the edge seal 260, such as on an outer surface 267 of the edge seal 260. It is believed that the complete or partial formation of the structures in the edge seal 260 can enhance the reliability of edge seal, and avoid penetration of moisture, the growth of defects in the formed device, and premature damage of edges, due to the application of mechanical forces during the photovoltaic apparatus 200 formation process or during normal operation. In some embodiments, the structures of the edge seal 260 can have a similar shape (e.g., a convex structure) to the structures 220 of the front sheet as shown in FIG. 1. In some embodiments, the structures of the edge seal 260 are more densely packed than the structures 220 of the front sheet. In some embodiments, the structures 220 are formed in the flexible front sheet 250 and edge seal 260 at the same time, while the one or more edges of the structure 220 are also aligned with one of the serial interconnects as discussed herein. The ability to align and form the structures 220 in a flexible front sheet 250 and edge seal 260 with the various elements in the photovoltaic apparatus 200 during a single process step can thereby reduce the number of processing steps, production time and reduce the production cost of the photovoltaic apparatus 200.

FIG. 2A is a cross sectional view of a release sheet 300 disposed over the photovoltaic apparatus 200 of FIG. 1 after the lamination process has occurred, according to an embodiment of the disclosure provided herein. FIG. 2B is a top view diagram illustrating the release sheet 300 of FIG. 2A, according to an embodiment of the disclosure provided herein. The release sheet 300 can be used to form the structures 220 in the front sheet 250 during a lamination process. In some embodiments, a plurality of fibers can be included in the release sheet 300 to create incompressible portions of the release sheet 300 to compress portions of the front sheet 250 during the lamination process. The release sheet 300 can further include a binder to hold one or more sections of the fibers together in the release sheet 300. The binder can be a flexible material, such as polymer binder (e.g., polytetrafluoroethylene (PTFE) or silicone), that does not melt at temperatures (e.g., 150° C.) reached during the lamination process. For example, in some embodiments polymers having a melting temperature of 200° C. or higher can be used as the binder for the release sheet 300. Because the release sheet 300 is stable at the lamination conditions, the release sheet 300 can be reused to perform many laminations, such as greater than 100 laminations.

In one embodiment, the release sheet 300 may include an outer frame 302 and an inner sheet 310. The outer frame 302 is the side of the release sheet that is contacted by the lamination system (not shown). The inner sheet is the side that contacts the photovoltaic apparatus 200. The outer frame 302 and the inner sheet 310 may be bound together or otherwise connected to form an integral structure. The outer frame 302 includes an inner section 306 and an outer section 304 disposed around the inner section 306. The inner section 306 can contact the edge seal 260 during the lamination process. As shown in View A of FIG. 2A, the inner section 306 of the outer frame 302 can be formed of densely packed fibers 303 (e.g., glass fibers or a woven glass web) with a coating 308 of non-stick material, such as PTFE or ETFE, disposed on the fibers 303. In some embodiments, the fibers 303 in the outer frame 302 may be so densely packed that the fibers 303 contact each other. However, in other embodiments, the fibers 303 may be spaced apart from each other. A binder 307, such as silicone, may be used to hold the fibers 303 together in some embodiments. Using densely packed fibers to form the outer frame 302 can prevent any of the edge seal 260 from spreading into portions of the release sheet 300 and sticking to the release sheet 300 during removal of the release 300 from the photovoltaic apparatus 200 after the lamination process.

The inner section 306 can include a recess 327 that remains spaced apart from the front sheet 250 during the lamination process to accommodate the front overlap 268 (FIG. 1) of the edge seal 260. The dimensions of the recess 327 can be adjusted to modify the thickness in the Z-direction of the front overlap 268, which can affect the strength of the edge seal 260. The recess 327 can have a reduced thickness in the Z-direction relative to the thickness of other portions of the inner section 306 to accommodate the front overlap 268 of the seal 260. For example, in some embodiments, the fibers (e.g., fibers 303) disposed adjacent to the recess 327 have a reduced thickness in the Z-direction relative to other fibers in the inner section 306. The thickness of the recess 327 in the Z-direction can be from about 0.2 mm to about 5 mm, such as from about 0.5 mm to about 2 mm.

The inner section 306 can further include an inner edge 306$_I$ that extends from the recess 327 to inner sheet 310. When the release sheet is placed on the photovoltaic apparatus 200 (e.g., during the lamination process) the inner edge 306$_I$ can extend down to the front sheet 250 to act as a wall to contain edge seal material in its fluid form from extending over undesired locations of the photovoltaic apparatus 200, such as over the photovoltaic device 100 (FIG. 1). The inner edge 306$_I$ may, for example, prevent masking of photovoltaic cells 101-104 by edge seal material.

The inner section 306 can further include a ramp 322 that extends from the recess 327 to the outer section 304. The ramp 322 can extend for a substantial distance away from the front sheet 250 to ensure that the edge seal 260 can make sufficient contact with the back sheet 210 to ensure a strong adhesion between the edge seal 260 and the back sheet 210.

The outer section 304 of the outer frame 302 can contact the back sheet 210 and the edge seal 260 during the lamination process. The outer section 304 can have a similar structure of densely packed fibers (e.g., fibers 303) coated with a non-stick material (e.g., coating 308). In some embodiments, the fiber 303 may be held together by a binder (e.g., binder 307). In some embodiments, the fibers in the outer section 304 may have some different properties than the fibers 303 shown in View A, such as different dimensions. Furthermore, in some embodiments, one or more additional layers of fibers may be stacked on top of each other in the outer section 304 to account for increased thickness in the Z-direction of the outer section 304 relative to the inner section 306.

Alternatively, in some embodiments, a plate coated with a non-stick material, such as a PTFE-coated plate may be used for one or more of the outer section 304 and the inner section 306 to provide a smooth non-stick surface to apply to the edge seal 260 and the back sheet during the lamination process. As another alternative, in some embodiments a plate embossed with one or more patterns and coated with a non-stick material, such as PTFE, may be used for one or more of the outer section 304 and the inner section 306. As yet another alternative, in some embodiments, a web of fibers, such as a web including fibers extending the X-direction and fibers extending in the Y-direction may be woven together. The woven structure of such an embodiment can form a strong fabric and obviate the need to use a binder, such as binder 307. As yet another alternative, the outer section 304 and/or inner section 306 can be formed of a polyimide tape, such as Kapton®, a trademark of the DuPont™ Corporation. Furthermore, in some embodiments the top side of the release sheet 300 in the Z-direction can be formed of ETFE, PTFE, silicone, or other non-stick material, such as a PTFE coated metal.

The outer section 304 can include an extension 323 that extends below the ramp 322. The extension 323 can have an inner edge 324 for contacting the edge seal 260 and a lower surface 325 for contacting the back sheet 210. The extension 323 can act as a wall to contain edge seal material in its fluid state when the lower surface 325 is contacting the back sheet 210. The outer section 304 can have a thickness in the Z-direction from about 1 mm to about 40 mm, such as from about 2 mm to about 20 mm. In some embodiments, the outer frame 302 can have a width in the X-direction from about 15 mm to about 75 mm, such as about 30 mm to about 60 mm, such as about 45 mm. Furthermore, portions of the outer frame 302, such as the ramp 322 can have a thickness in the Z-direction from about 0.1 mm to about 10 mm, such as from about 0.3 mm to about 3 mm, such as about 0.8 mm.

The densely packed incompressible fibers (e.g., fibers 303) of the outer frame 302 can transfer significant pressure to the surface of the edge seal 260 during the lamination process to create a strong seal around the edges of the front sheet 250, such as edge 253 (FIG. 1). In some embodiments, the front sheet 250 includes a plurality of layers, such as one or more UV barrier layers, one or more water barrier layers, and one or more adhesive layers. The UV layer(s) can block UV radiation incident upon the top of the front sheet 250, but the regions around the edges of the front sheet 250 can be exposed to UV radiation during normal use. Left unprotected, UV radiation can cause degradation or delamination of the front sheet 250 and other layers, which can expose the interior of the photovoltaic apparatus 200 to air and water, which can reduce the useful life of the photovoltaic apparatus 200. Thus, the pressure applied by the incompressible fibers (e.g., fibers 303) of the outer frame 302 to the edge seal 260 during the lamination process creates a strong seal around the edges (e.g., edge 253 of FIG. 1) of the front sheet 250 to prevent damaging UV radiation from entering the photovoltaic apparatus 200 around the edges of the front sheet 250.

The inner sheet 310 of the release sheet 300 can include an inner portion 314 and an outer portion 312 disposed around the inner portion 314. The outer portion 312 can contact the outer portions of the front sheet 250, such as portions of the front sheet 250 that do not overlie the photovoltaic cells 101-104, during the lamination process. The outer portion 312 may overlie the busbars 170, 180. In some embodiments, the outer portion 312 of the inner sheet 310 may have a structure that is the same as the structure shown in View A including a plurality of densely packed fibers (e.g., fibers 303) that may contact each other, where the fibers can be coated with a non-stick material (e.g., coating 308) and held together by a binder 307. The structure of the outer portion 312 may also take the alternative forms described above for the outer frame 302, such as the non-stick plate (e.g., PTFE coated plate) or the web of fibers extending in two directions and woven together to form a non-stick fabric that obviates the need to use the binder (e.g., binder 308).

Referring to FIGS. 1 and 2B, using the structure formed by the plurality of densely packed incompressible fibers (e.g., fibers 303), and/or one of the alternative structures described above, to compress portions of the front sheet 250 can improve the adhesion between the busbars 170, 180 and the layers of the photovoltaic cells at the ends of the array. In one example, the adhesion between the first busbar 170 and the back-contact layer 120 of photovoltaic cell 101 and adhesion of the second busbar 180 and the front-contact layer 150 of photovoltaic cell 104 can be improved. The improved adhesion between the busbars 170, 180 and these layers of the photovoltaic cells 101, 104 improves the electrical conductivity of these electrical connections and improves the efficiency of the photovoltaic apparatus 200.

The inner portion 314 of the inner sheet 310 can contact the inner portions of the front sheet 250 during the lamination process, such as portions of the front sheet 250 that overlie the photovoltaic cells 101-104 (FIG. 1). As shown in View B of FIG. 2A, the structure of the inner portion 314 can include a binder 315 that holds together a first plurality of fibers 311 that are spaced apart in the X-direction. A non-stick coating 316 may be applied to surfaces of the fibers 311 and binder 315 that face the photovoltaic apparatus 200 during the lamination process. As shown in FIG. 2B, the inner portion 314 may further include a second plurality of fibers 318 extending in the Y-direction. The non-stick coating 316 may also cover surfaces of the fibers 318 that face the photovoltaic apparatus 200 during the lamination process, so that the non-stick coating 316 forms the entire surface of the inner portion 314 that contacts the front sheet 250 during the lamination process. Although the fibers 311, 318 are shown perpendicular to each other, other arrangements may be used, such as a non-rectangular grid formed by the fibers 311, 318. In some embodiments, one or more second plurality of fibers 318, may be oriented at an angle that is not perpendicular to the monolithic interconnects 191. The non perpendicular orientation of some fibers may confer flexibility properties to the photovoltaic apparatus 200 that favor bending in a selected direction. A non-perpendicular orientation of the second plurality of fibers 318 may help better compensate stresses within the apparatus, such as stresses introduced by laminating. In yet other embodiments, the second plurality of fibers 318 may be oriented over a plurality of angles that are not perpendicular to the monolithic interconnects 191. In further embodiments, the second plurality of fibers 318 may be oriented over a plurality of angles that may form a weave which may be used to form polygonal structures, such as hexagonal structures or octagonal structures upon lamination. Furthermore, in some embodiments, the second plurality of fibers 318 may be omitted.

In some embodiments, the fibers 311 are positioned to overlie the serial interconnects 191 between the photovoltaic cells (e.g., photovoltaic cells 101-104 of FIG. 1). For example, the length of the fibers 311 in the Y-direction can overlie the length of the serial interconnects 191 in the Y-direction. In some embodiments, the fibers 311 can be spaced apart from each other in the X-direction by about 1 mm to about 20 mm, such as by about 2 mm to about 5 mm wide, such as by about 4 mm. The fibers can have a thickness in the Z-direction from about 0.3 mm to about 1.2 mm, such as about 0.85 mm. Furthermore in some embodiments, the inner sheet 310 can have dimensions in the X-Y plane that are substantially similar (e.g., ±20 mm) to the dimensions of the encapsulant layers of the photovoltaic apparatus 200 (i.e., the back-side adhesive 230 and the front-side adhesive 240).

During the lamination process, the first and second plurality of fibers 311, 318 compress portions of the front sheet 250 to form the edges 221 of the structures 220 that are formed on the front sheet 250. Although FIG. 2A only shows the edges 221 spaced apart in the X-direction, the second plurality of fibers can form similar edges (not shown) that are spaced apart in the Y-direction, so that the first and second plurality of fibers 311, 318 shown in FIG. 2B can form structures 220 that appear rectangular when viewed from above the front sheet 250. The portions of the front sheet 250 disposed between the edges 221 of the structures 220 are compressed less than the edges 221 of the structures 220. This reduced compression of the portions may be because, in some embodiments of the release sheet 300, at least the inner portion 314 of the release sheet may be devoid of material between the first and second plurality of fibers 311, 318. In some other embodiments of the release sheet 300, at least the inner portion 314 of the release sheet may include a stretchable film of material, or flexible binder 315, for example that if formed of or is coated with the non-stick coating 316, that may deform much more than the non-stretchable and incompressible fibers 311, 318. Thus, the portions of the front sheet 250 within the edges 221 of the structures 220 have a thickness in the Z-direction greater than the thickness of the edges 221 in the Z-direction. Although the structures 220 in FIG. 2A have a rounded surface, in some embodiments, the structures 220 may have a rounded surface near the edges 221, such as over the serial interconnects 191, and a flat surface away from the edges 221, such as locations between the serial interconnects 191. Furthermore, in some embodiments, additional features may be formed on portions of the second surface 252 (FIG. 1) within the edges 221 of the structures 220. For example, in some embodiments, the additional features may include areas of increased opacity or areas that include striations or areas that exhibit a first optical aspect when viewed from a first angle and a second optical aspect when viewed from a second angle.

In one embodiment, the lamination process may be performed using a heating, laminating, and cooling sequence. First the release sheet 300 is aligned on top of the unlaminated photovoltaic apparatus (photovoltaic assembly). For example, in one embodiment an inner edge of the $306_I$ of the inner section 306 of the outer frame 302 can be aligned with an inner edge $260_I$ of the edge seal 260 to confirm that the release sheet 300 and the edge seal 260 are properly aligned before laminating. The release sheet 300 may be placed directly on the unlaminated photovoltaic apparatus or intermediate layer (e.g., a flexible PTFE coated sheet) may be placed between the two. During the heating step, the release sheet is placed on the photovoltaic apparatus 200 and a temperature from about 125° C. to about 175° C., such as about 150° C. can be applied to the heating plate of the laminating machine at atmospheric pressure for a duration from about 300 seconds to about 700 seconds, such as for about 480 seconds. During the laminating process, the temperature from the heating phase can be maintained and a pressure from about 500 mbar to about 1 bar, such as about 750 mbar can be applied to the release sheet 300 and the photovoltaic apparatus 200 for a duration from about 300 seconds to about 700 seconds, such as for about 500 seconds. During the cooling step, the temperature of the plate used as the heating plate or a separate cooling plate of the laminating machine can be lowered to about 10° C. to about 50° C., such as to about 25° C. for a duration from about 300 seconds to about 800 seconds, such as for about 600 seconds. After the cooling step, the release sheet 300 can be removed and the photovoltaic apparatus 200 is formed.

Figure 3:
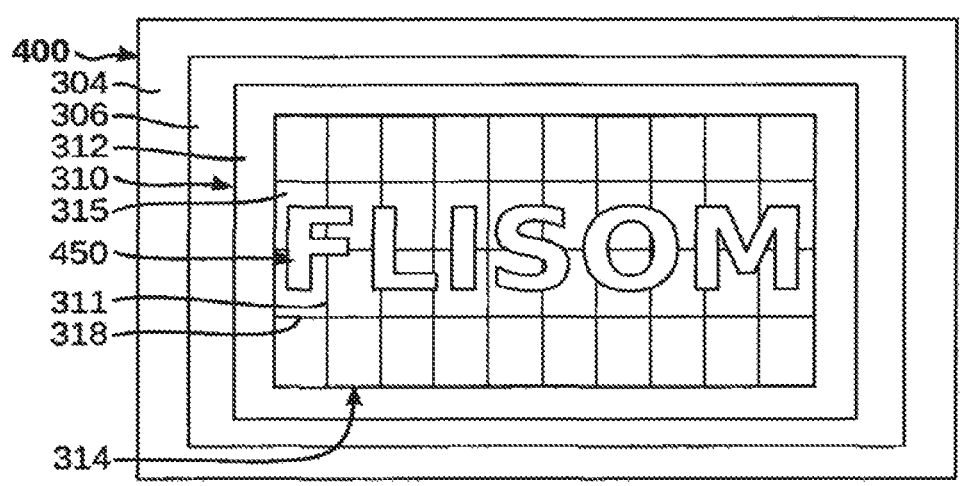
FIG. 3 is a top view diagram illustrating a release sheet, according to an embodiment of the disclosure provided herein.

FIG. 3 is a top view diagram illustrating a release sheet 400, according to an embodiment of the disclosure provided herein. The release sheet 400 is similar to the release sheet 300 described above except that the release sheet 400 includes portions of the inner portion 314 of the inner sheet 310 that have been removed. For example, the fibers 315 and any binder (e.g., binder 315) can be removed from portions of the inner sheet 310 to make one or more holes to form a label 450 that can be recognized by a user. Other than having different dimensions or quantities (e.g., number of fibers), the other components besides the inner sheet 310 of the release sheet 400 are the same as the release sheet 300, so the same reference numerals are used in FIG. 3 to identify these components.

Figure 4:
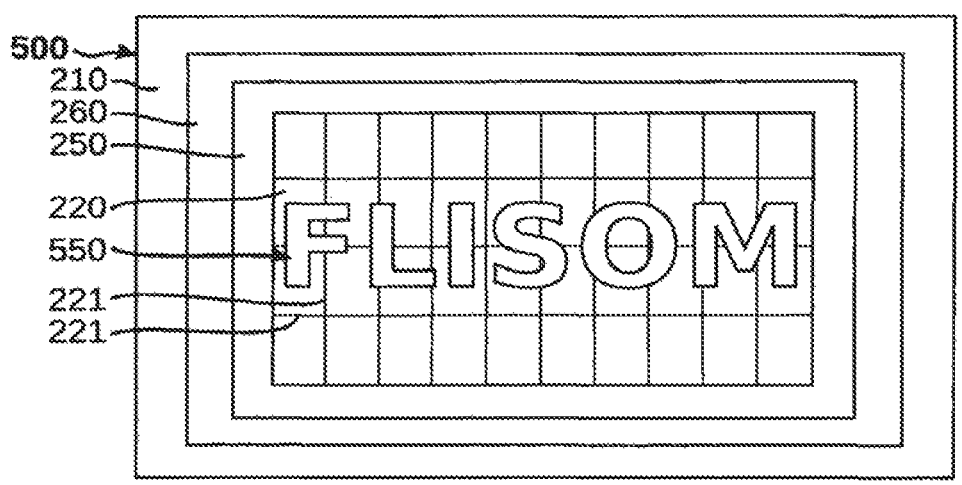
FIG. 4 is a top view diagram illustrating a photovoltaic apparatus that has been laminated with the release sheet of FIG. 3, according to an embodiment of the disclosure provided herein.

FIG. 4 is a top view diagram illustrating a photovoltaic apparatus 500 that has been laminated with the release sheet 400, according to an embodiment of the disclosure provided herein. The photovoltaic apparatus 500 is similar to the photovoltaic apparatus 200 described above except that the photovoltaic apparatus 500 includes an embossed label 550 in the pattern of the label 450 of the release sheet 400. The label 550 is embossed relative to the portions of the front sheet 250 surrounding the label 550 because the fibers 311, 318 and any binder 315 of the release sheet 400 were not present to compress the portions of the front sheet 250 positioned beneath the label 450 during the lamination process. Other than having different dimensions or quantities (e.g., number of structures 220), the other components of the photovoltaic apparatus 500 are the same as the photovoltaic apparatus 200, so the same reference numerals are used in FIG. 4 to identify these components. The labels 450, 550 can include and words, letters, logos, or other symbols that are unrelated to the functionality of the photovoltaic apparatus 500 and can be recognized by a user. For example, a rectangular grid of structures 220 formed on the front sheet 250 may be understood as the label's 450, 550 background texture with the grid of structures 220 being related to the functionality of the photovoltaic apparatus 500.

In other embodiments, the inner section 314 may include one or more portions that have been removed to form the outline of a label 450, 550 and replaced by portions of material, such as material used to form inner sheets, but with the first or second plurality of fibers 311, 318 set at an orientation that is different from that is different from that forming the inner section 314.

In yet other embodiments, the inner section 314 may include one or more portions that have been added (not shown) to form the outline of a label 450, 550. The portions may include a material that is different from that used to form inner sheets. As a variation of the embodiment, the portions may include material used to form inner sheets but with the first or second plurality of fibers 311, 318 set at an orientation that is different from that is different from that forming the inner section 314. The portions, or part of the portions, that have been added may be added between the front sheet 250 and the inner sheet 310, for example to produce a contrasted visual effect, or over the inner sheet 310, for example to produce an embossing effect with a pattern that may blend at its periphery with the pattern of inner sheet 310.

Thus, using the release sheet 400 allows for a permanent label 550 to be embossed onto the front sheet 250 without adding any extra steps to the process of forming the photovoltaic apparatus 500. Other designs or graphics can also be embossed or debossed onto the surface of the front sheet 250. For example, in one embodiment a design may be embossed or debossed onto a PTFE plate that can form part of the release sheet, where the embossed/debossed graphic on the PTFE plate can create a corresponding debossed/embossed graphic on the front sheet 250.

Referring to FIGS. 2A, 2B, because the lower surface 325 of the extension 323 of the outer frame 302 can contact the back sheet 210 (first location), and the inner edge $306_I$ of the inner section 306 of the outer frame 302 can contact the front sheet 250 (second location) when the release sheet 300 is placed on the photovoltaic apparatus 200, the release sheet 300 can act as a mold for the edge seal 260. For example, the outer frame 302 has a lower surface (first surface) extending from the front sheet 250 at the first location along the recess 327, down the ramp 322, and down the inner edge 324 of the extension 323 to the back sheet 210. In this example, the lower surface is spaced apart from the front sheet 250 and the back sheet 210 between the first location and the second location to act as a mold for the edge seal 260. In one embodiment, the edge seal material can be placed on the front sheet 250 and the back sheet 210, and then the release sheet 300 can be lowered onto the unlaminated photovoltaic apparatus enabling the release sheet 300 to create a mold for the edge seal material so that the edge seal 260 can be formed into the shape shown in FIG. 2A or other shapes as desired.

Thus, by using the release sheet 300 during the lamination process, in a single step (1) the photovoltaic apparatus 200 (FIG. 1) can be laminated, (2) a plurality of structures 220 (FIG. 1) can be formed on the front sheet 250 that can improve light absorption and reduce deformations on the front sheet 250, (3) adhesion can be improved between the busbars 170, 180 (FIG. 1) and the photovoltaic cells, (4) a label 550 (FIG. 4) can be embossed or debossed onto the front sheet 250 and (5) the edge seal 260 (FIG. 2A) can be molded into form to protect the photovoltaic apparatus 200 from potential damage from the environment. Because the lamination process is generally used to form photovoltaic apparatuses, this disclosure provides numerous benefits, some of which are noted in the preceding sentence, that can be obtained without adding any steps to the process of forming the photovoltaic apparatus besides placing a release sheet on the unlaminated photovoltaic apparatus before the lamination process.

While the foregoing is directed to embodiments of the present disclosure, other and further embodiments of the disclosure may be devised without departing from the basic scope thereof, and the scope thereof is determined by the claims that follow.

What is claimed is:

1. A method of forming a photovoltaic apparatus, comprising:
   placing a release sheet over a front sheet of a photovoltaic assembly, wherein:
      the release sheet comprises a first plurality of fibers spaced apart in a first direction, and
      the photovoltaic assembly comprises a photovoltaic device including an array of photovoltaic cells extending in the first direction; and
   forming a plurality of structures on a first surface of the front sheet by performing a laminating process on the release sheet, the front sheet, and the photovoltaic assembly, wherein
      the release sheet includes an outer frame disposed around the first plurality of fibers,
      the outer frame includes a first surface extending from the front sheet at a first location to a back sheet of the photovoltaic assembly at a second location,
      the release sheet is spaced apart from the front sheet and the back sheet of the photovoltaic assembly between the first location and the second location, and an edge seal is molded between a first surface of the release sheet and the back sheet during the lamination process.

2. The method of claim 1, wherein the release sheet is placed on the front sheet before performing the lamination process or during the lamination process.

3. The method of claim 1, wherein:
the photovoltaic device further includes a plurality of serial interconnects disposed between and electrically connecting consecutive photovoltaic cells of the array of photovoltaic cells,
each fiber of the first plurality of fibers has a length extending in a second direction, and
the first plurality of fibers substantially overlie a length of one of the serial interconnects extending in the second direction.

4. The method of claim 3, wherein each structure of the plurality of structures has an edge that overlies one of the serial interconnects.

5. The method of claim 1, wherein the release sheet contacts an edge seal of the photovoltaic assembly during the laminating process, wherein the edge seal is disposed between the front sheet and a back sheet of the photovoltaic assembly.

6. The method of claim 1, wherein the release sheet includes an outer frame including a second plurality of fibers, wherein the fibers of the second plurality of fibers are spaced apart less in the first direction than the fibers of the first plurality of fibers are spaced apart in the first direction.

7. The method of claim 1, wherein the release sheet includes an outer frame including a second plurality of fibers, the fibers of the second plurality of fibers contacting each other along a length of the fibers.

8. The method of claim 7, wherein the second plurality of fibers are coated with a non-stick material.

9. The method of claim 1, wherein a surface of the release sheet facing the photovoltaic assembly is coated with a non-stick material.

10. The method of claim 1, wherein the first surface of the release sheet includes a recess extending above the front sheet and the edge seal is molded between the first surface of the release sheet and the front sheet during the lamination process.

11. The method of claim 1, wherein:
the release sheet comprises an inner sheet that includes the first plurality of fibers, and
the inner sheet comprises a label including one or more holes.

12. The method of claim 1, wherein the release sheet further comprises one or more holes, and the method further comprises disposing the release sheet over the front sheet to form an embossed label on the front sheet during the lamination process.

13. The method of claim 1, wherein:
the release sheet comprises an inner sheet that includes the first plurality of fibers,
the inner sheet comprises a label including one or more holes, and
the one or more holes are filled with a material other than a material of the first plurality of fibers.

14. A method of forming a photovoltaic apparatus, comprising:
placing a release sheet over a front sheet of a photovoltaic assembly, wherein:
the release sheet comprises a first plurality of fibers spaced apart in a first direction and an outer frame disposed around the first plurality of fibers, and
wherein the outer frame includes a first surface extending from the front sheet at a first location to the back sheet of the photovoltaic assembly at a second location, and wherein the release sheet is spaced apart from the front sheet and the back sheet of the photovoltaic assembly between the first location and the second location, and
the photovoltaic assembly comprises:
the back sheet; and
a photovoltaic device comprising:
an array of photovoltaic cells extending in the first direction; and
a plurality of serial interconnects having a length that extends in a second direction, the second direction perpendicular to the first direction, and the first direction and the second direction are parallel to a surface of the photovoltaic cells, wherein each serial interconnect is disposed between and electrically connects consecutive photovoltaic cells of the array; and
an edge seal comprising a front overlap, the edge seal extending between the back sheet and the front sheet; and
forming a first plurality of structures on a first surface of the front sheet and molding the edge seal between a first surface of the release sheet and the back sheet by performing a laminating process on the release sheet, the front sheet, and the photovoltaic assembly.

15. The method of claim 14, wherein each structure of the first plurality of structures has one or more edges aligned with a serial interconnect of the plurality of serial interconnects.

16. The method of claim 14, wherein:
the back sheet has a first surface facing the photovoltaic device,
the front sheet has a first surface facing the photovoltaic device and a second surface opposite to the first surface, and
the edge seal extends from the first surface of the back sheet to the second surface of the front sheet.

17. A method of forming a photovoltaic apparatus, comprising:
placing a release sheet over a front sheet of a photovoltaic assembly, wherein:
the release sheet comprises a first plurality of fibers spaced apart in a first direction and an outer frame disposed around the first plurality of fibers, and wherein the outer frame includes a first surface extending from the front sheet at a first location to the back sheet of the photovoltaic assembly at a second location, and wherein the release sheet is spaced apart from the front sheet and the back sheet of the photovoltaic assembly between the first location and the second location, and
the photovoltaic assembly comprises:
the back sheet;
a photovoltaic device comprising:
an array of photovoltaic cells extending in the first direction; and
a plurality of serial interconnects having a length that extends in a second direction, the second direction perpendicular to the first direction, and the first direction and the second direction are parallel to a surface of the photovoltaic cells, wherein each serial interconnect is disposed between and electrically connects consecutive photovoltaic cells of the array; and a back-side adhesive disposed between the back sheet and the photovoltaic device; and an edge seal comprising a front overlap, the edge seal extending between the back sheet and the front sheet; and forming a first plurality of structures on a first surface of the front sheet and molding the edge seal between a first surface of the release sheet and the back sheet by performing a laminating process on the release sheet, the front sheet, and the photovoltaic assembly.

18. The method of claim 17, wherein the edge seal includes an outer surface comprising a second plurality of structures comprising convex embossings.

19. The method of claim 17, wherein the front overlap extends past the second surface of the front sheet in a third direction, the third direction perpendicular to the first direction and the second direction and the third direction extending away from the front sheet.

* * * * *